(12) United States Patent
Sutardja et al.

(10) Patent No.: US 7,184,231 B1
(45) Date of Patent: *Feb. 27, 2007

(54) PRECOMPENSATION CIRCUIT FOR MAGNETIC RECORDING

(75) Inventors: Pantas Sutardja, San Jose, CA (US); Chi Fung Cheng, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 11/250,373

(22) Filed: Oct. 17, 2005

Related U.S. Application Data

(63) Continuation of application No. 10/810,893, filed on Mar. 29, 2004, now Pat. No. 6,956,708, which is a continuation of application No. 09/874,949, filed on Jun. 5, 2001, now Pat. No. 6,721,114.

(60) Provisional application No. 60/289,529, filed on May 9, 2001.

(51) Int. Cl.
*G11B 5/09* (2006.01)

(52) U.S. Cl. ...................................... 360/45

(58) Field of Classification Search .................. None
See application file for complete search history.

(56) References Cited

U.S. PATENT DOCUMENTS

| 4,878,028 A | 10/1989 | Wang et al. ............... 327/278 |
| 5,986,830 A | 11/1999 | Hein .......................... 360/45 |
| 6,133,861 A | 10/2000 | Jusuf et al. .................. 341/68 |
| 6,288,858 B1 | 9/2001 | Arnett et al. ................ 360/45 |
| 6,404,572 B1 | 6/2002 | Hong ........................ 360/45 |
| 6,721,114 B1 | 4/2004 | Sutardja et al. ............. 360/45 |
| 2004/0165506 A1* | 8/2004 | Gushima et al. ........ 369/59.11 |
| 2006/0107011 A1* | 5/2006 | Nystuen et al. ............ 711/167 |

* cited by examiner

*Primary Examiner*—Wayne Young
*Assistant Examiner*—Glenda P. Rodriguez

(57) ABSTRACT

In a precompensation circuit for magnetic recording of data signals, a clock produces clock signals at a predetermined rate to clock the recording of the data signals. A clock delay generator generates clock delay data relative to the generated clock signals for successive data signals to be recorded. The clock delay data for each data signal is formed according to the states of a set of adjacent data signals. n>1 programmable clock delay units operate sequentially to control the recording times of the successive data signals. Each clock delay unit receives the clock delay data for one data signal in each sequence of n successive data signals and determines recording time of the one data signal according to the clock delay data for the one data signal in the sequence.

41 Claims, 5 Drawing Sheets

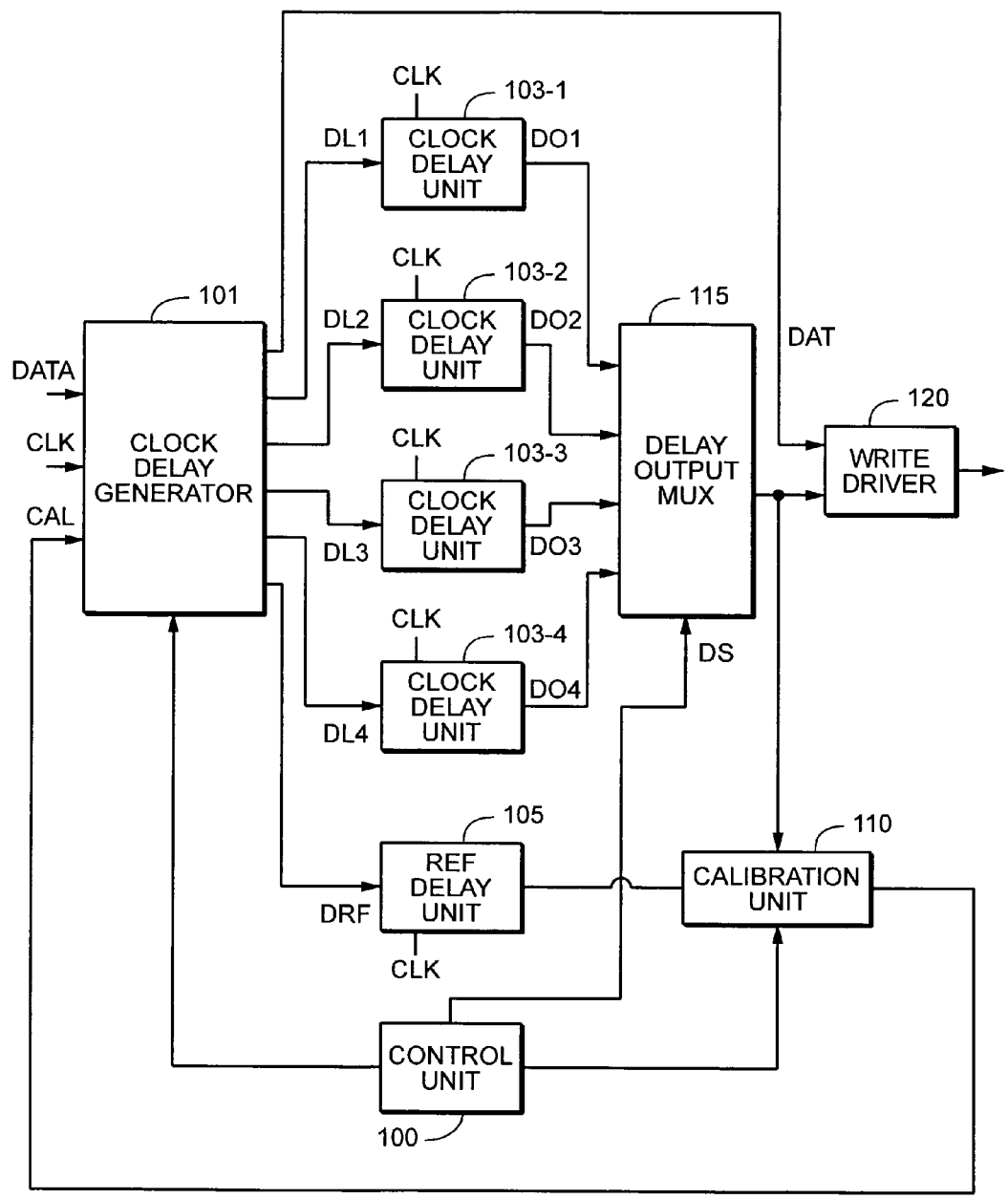
FIG._1

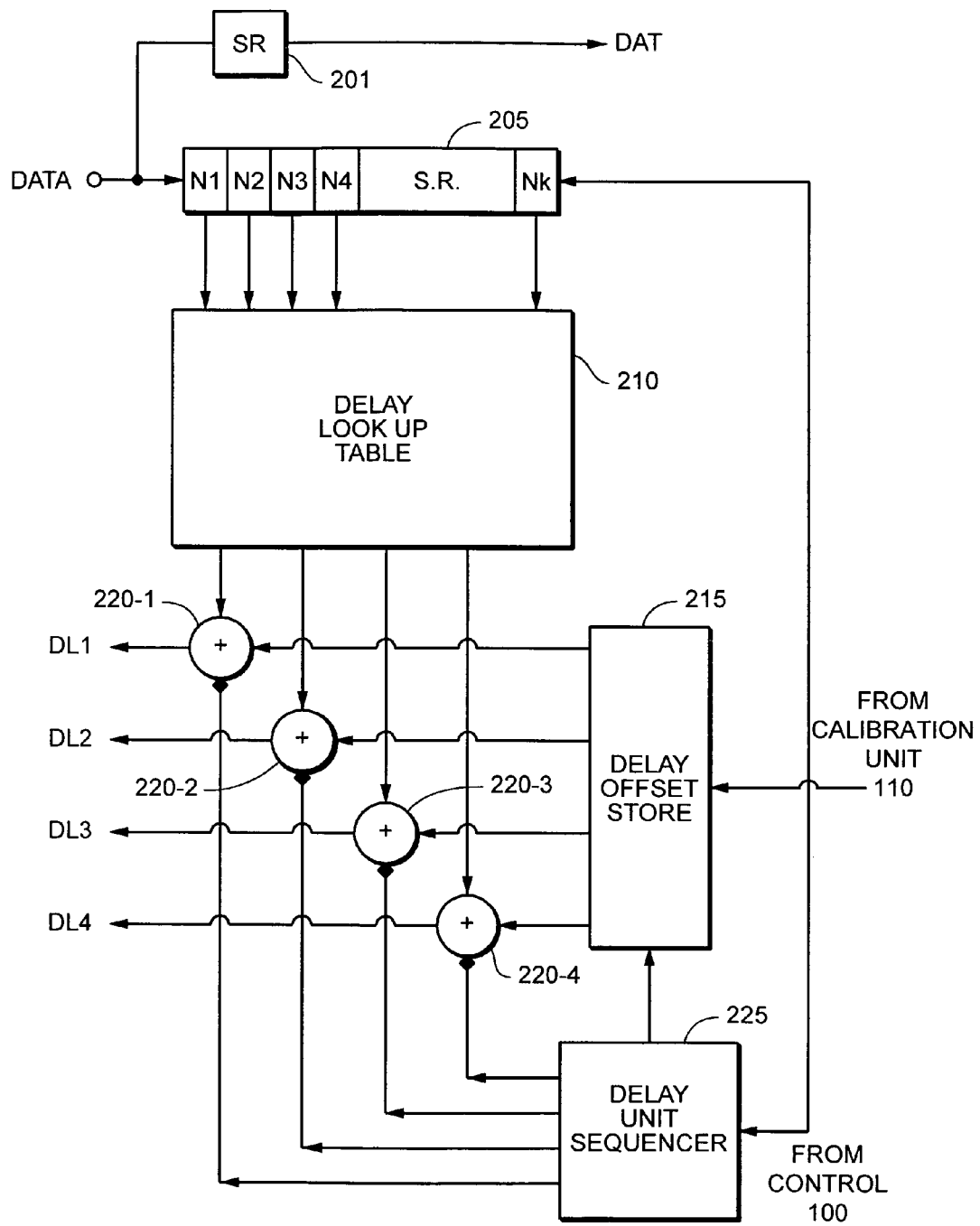
FIG._2

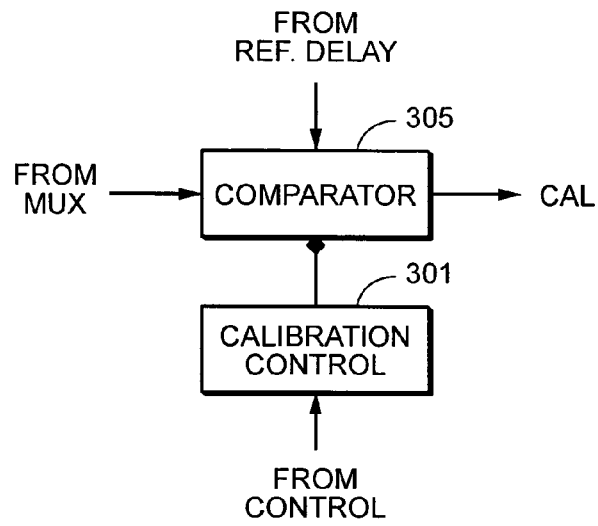
FIG._3
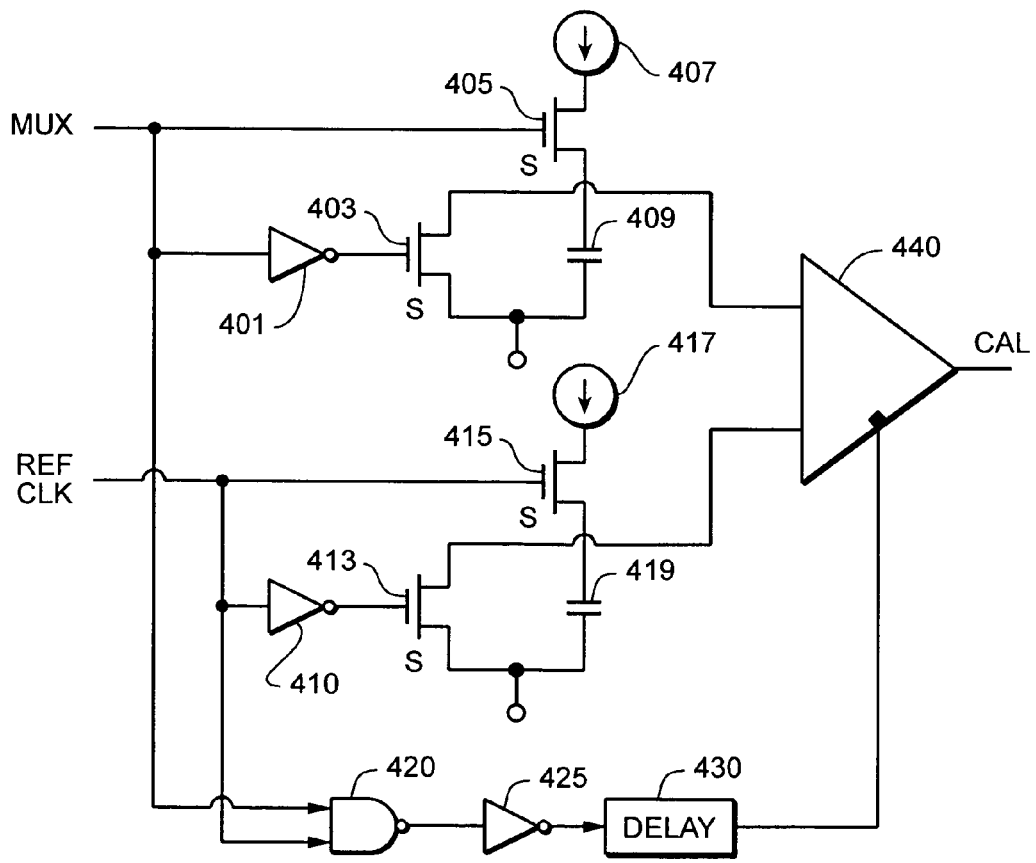
FIG._4

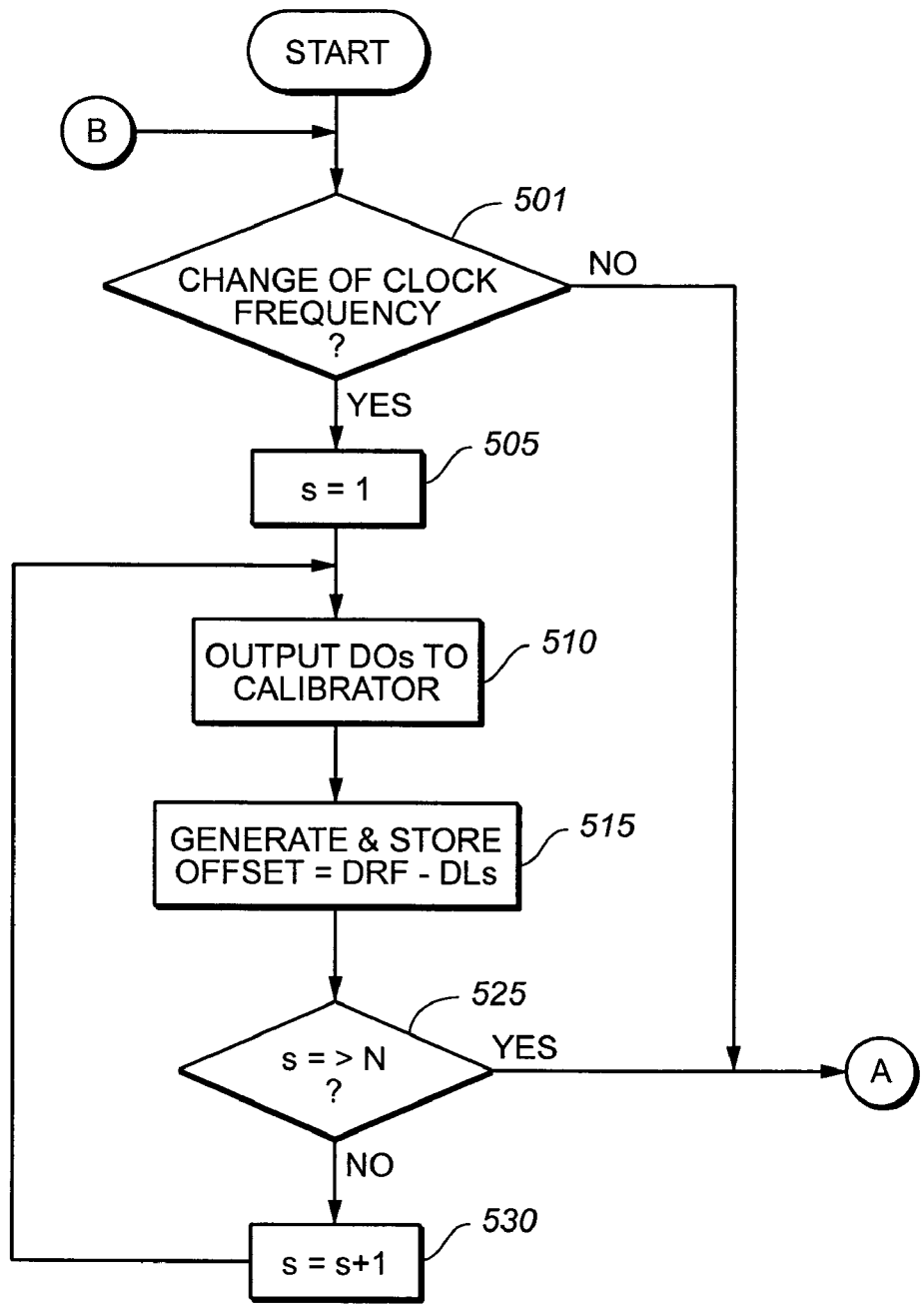
FIG._5

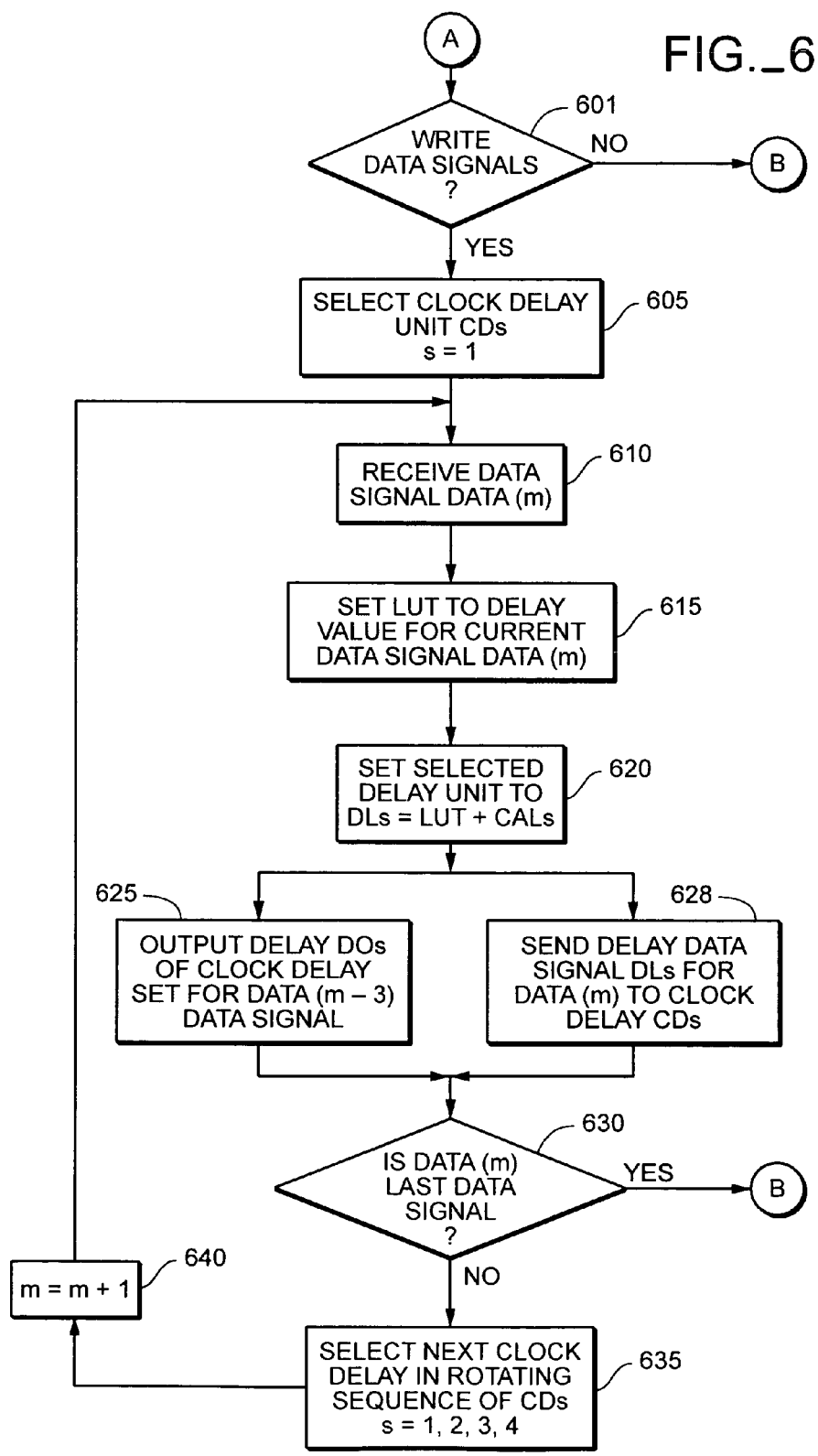

PRECOMPENSATION CIRCUIT FOR MAGNETIC RECORDING

This application is a continuation of U.S. application Ser. No. 10/810,893, filed Mar. 29, 2004, now U.S. Pat. No. 6,956,708 which is a continuation of U.S. application Ser. No. 09/874,949, filed Jun. 5, 2001, now U.S. Pat. No. 6,721,114 which claims priority under 35 U.S.C. § 119(e) from U.S. Provisional Application No. 60/289,529, entitled "Precompensation Circuit for Magnetic Recording," filed May 9, 2001, the entire contents of each of which are incorporated by reference herein.

BACKGROUND

1. Field of the Invention

The invention relates to magnetic recording of data and more particularly to pre-compensation in writing of data to a magnetic medium.

2. Background Information

In magnetic recording, data is written on or read from one or more data tracks of a magnetic storage medium such as a hard disk. The data tracks generally form concentric rings on the surfaces of each of plural hard disks that constitute the magnetic recording device. When writing to such a track, the disk is rotated at predetermined speed, and electrical signals applied to a magnetic read/write head floating over the track are converted to magnetic transitions on the track. The magnetic transitions represent digital data encoded so that each transition may correspond to a ONE bit value and the absence of a transition may correspond to a ZERO bit value as in a "non return to zero inverted" (NRZI) encoding.

To obtain high density recording, magnetic transitions representing data patterns are closely packed on the hard disk magnetic medium. Each transition or absence of a transition of the recording bit sequence is located in a window in which a flux reversal may occur. Such closely packed data bits influence each other so that non-linear magnetic shifting of transitions and bit interference are likely to occur during recording. As a result, the reading of the high density recorded data pattern may be adversely affected. In an example, any device mismatch in a high data rate write data path causes positive/negative transition skew known as pulse pairing so that writing of a single tone square wave can result in a write transition spacing that has other than a 50% duty cycle.

When writing to a high density magnetic recording channel, it is therefore necessary to adjust the position of transitions in the data stream to correct for the influence of nearby transitions so that transitions in the recovered data stream are evenly placed. Such precompensation of data being recorded is accomplished by changing the timing of the magnetic flux reversal in a clock period to offset the magnetic transition shift and interference effects of adjacent and nearby bits. In this way, the transition shift of a bit due to the pattern of preceding and/or succeeding bits is anticipated and the bit recording time is changed to compensate for the magnetic transition shift due to the effects of surrounding bits.

In one type of known precompensation exemplified by the disclosure of U.S. Pat. No. 4,878,028, issued Oct. 31, 1989 to Y. C. Wang, a precompensation delay arrangement for writing data to disks has plural delay information elements, each providing a fixed delay that is a percentage of the bit cell time period according to the data bit pattern. In the recording of the data pattern, one of the delay information elements is selected to provide a preset delay (early, nominal, or late) for recording a present data bit according to the preceding data bit pattern.

In another type of precompensation exemplified by U.S. Pat. No. 6,133,861, issued Oct. 17, 2000 to G. Jusuf et al. and assigned to the same assignee, each of multiple decoders is supplied with a selectably variable version of a master clock. The delayed versions of the master clock are stably produced by delay elements using delay-locked feedback loops. Each of the delay elements is set at a different fixed delay and provides a differently delayed clock signal to a decoding circuit to which data to be recorded is supplied. A selection circuit selects one of the data decoding circuits responsive to the pattern of the preceding data bits.

In the aforementioned and other prior art arrangements, the timing of recording of each data bit is shifted to precompensate for the preceding data bit pattern. It is, however, required to provide $2^N$ delay altering elements each having a different delay to provide precompensation for a data pattern of N data bits. Accordingly, while only 4 delay altering elements generating different delays are needed for precompensation of a 2 data bit pattern, the number of required delay defining elements increases as the data bit pattern is increased. Eight delay altering elements are needed for precompensation based on a three data bit pattern and 16 delay altering elements are needed for precompensation based on a 4 data bit pattern. The increased number of delay altering elements to precompensate for larger data bit patterns adds to the cost and the complexity of magnetic recording system. Accordingly, It is desirable to provide a precompensation arrangement which utilizes a predetermined number of delay elements which is independent of the size of data bit patterns used for precompensation.

SUMMARY OF THE INVENTION

The invention is directed to a precompensation arrangement for magnetic recording of data signals in which a clock generator generates clock signals at a predetermined rate to clock the data signals to be recorded. Plural clock delay units provide delays to control the recording times of the data signals according to patterns of adjacent data signals. Recording of each data signal is delayed on the basis of the states of the adjacent data signals.

According to the invention, a clock delay generator generates clock delay data relative to the generated clock signals for each successive data signal responsive to the pattern of adjacent data signals. n>1 clock delay units operate to control recording times of the successive data signals according to the clock delay data. Each clock data unit generates an output signal that determines the recording time of one data signal in each sequence of n successive data signals according to the clock delay data received by the clock data unit for that data signal.

According to one aspect of the invention, one clock delay unit receives the clock delay data corresponding to an mth data signal while the clock delay unit that received the clock delay data corresponding to the (m−n+1)th data signal generates the output signal to determine the recording time of the (m−n+1) data signal.

According to another aspect of the invention, each clock delay unit is a reprogrammable clock delay unit that is reprogrammed according to the clock delay data for the one data signal received in each sequence of n data signals.

According to another aspect of the invention, each pattern of adjacent data signals includes one set of data signals immediately preceding the data signal for which clock delay data is generated, a set of data signals immediately succeeding the data signal for which the clock delay data is generated or a set of data signals surrounding the data signal for which the clock delay data is generated.

According to yet another aspect of the invention, a selector sequentially selects the output signals of the n clock delay units in each n data signal sequence to control the recording times of the successive data signals of the sequence.

According to yet another aspect of the invention, the clock delay generator includes a look up table which forms clock delay information relative to the generated clock signal for each successive data signal according to the pattern of adjacent data signals for each successive data signal.

According to yet another aspect of the invention, a reference clock delay unit produces reference clock delay data corresponding to the predetermined clock rate in response to the generated clock signals.

According to yet another aspect of the invention, the clock delay generator includes a look up table that produces clock delay information according to the set of adjacent data signals for each data signal, a unit that produces a reference clock delay signal and a unit that combines the clock delay information and the reference clock delay signal to form the clock delay data for each data signal.

According to yet another aspect of the invention, the reference clock delay unit includes a reprogrammable clock delay unit that is reprogrammed according to changes in the predetermined clock rate.

According to yet another aspect of the invention, a calibration unit calibrates each of the n clock delay units to the changed predetermined clock rate in response to a change in the predetermined clock rate.

According to yet another aspect of the invention, the calibration unit includes a comparator that compares the output signal of the reference clock delay unit to the output signals of the n clock delay units to form a reference value for each of the n clock delay units.

According to yet another aspect of the invention, each clock unit includes an interpolator for interpolating received clock delay data.

According to yet another aspect of the invention, each clock delay unit includes a phase locked loop that generates a data signal determining output in response to the clock delay data from the clock delay generator.

In an embodiment illustrative of the invention, the timing of data signals to be magnetically recorded is controlled by a precompensation circuit that includes a clock delay generator having a look up table to generate clock delay data for each successive data signal according to the pattern of adjacent data signals surrounding the data signal, a set of n same type programmable phase locked loop delay units operating sequentially to control the recording times of successive data signals based on the clock delay data and a calibrator that calibrates the programmable phase locked loop delay units to accommodate changes in recording clock rate. During writing of the data signals, each phase locked loop delay unit receives clock delay data for a one data signal in each sequence of n successive data signals and generates a delay output signal that sets the recording time of that data signal. While one phase locked loop delay unit receives the clock delay data for the mth data signal, the phase locked loop delay unit that received the (m−n+1)th data signal in the sequence outputs a signal to time the recording of the (m−n+1)th data signal. In response to a change in clock rate, the clock delay data for each delay unit is calibrated for the changed clock rate using a reference phase locked loop delay unit set according to the clock rate.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein:

FIG. 1 depicts a general block diagram of a precompensation arrangement illustrative of the invention.

FIG. 2 is a block diagram of a clock delay data generator useful in the precompensation arrangement of FIG. 1.

FIG. 3 is a block diagram of a calibration unit useful in the precompensation arrangement of FIG. 1.

FIG. 4 shows a comparator arrangement that may be used in the calibration unit of FIG. 3.

FIG. 5 is a flow chart illustrating calibration of the clock delay units of FIG. 1.

FIG. 6 is a flow chart illustrating the data signal delay operations of the precompensation arrangement of FIG. 1.

DETAILED DESCRIPTION OF THE PREFERRED EMBODIMENTS

FIG. 1 shows a general block diagram of a precompensation circuit illustrative of the invention. In FIG. 1, there are shown a control unit 100, a clock delay generator 101, clock delay units 103-1, 103-2, 103-3 and 103-4, a reference delay unit 105, a calibration unit 110, a delay output multiplexer 115 and a write driver 120. The clock delay generator has an output data signal DAT coupled to one input of the write driver 120. Delay data signal lines couple clock delay data signals DL1, DL2, DL3 and DL4 to the clock delay units 103-1, 103-2, 103-3 and 103-4, respectively, and a delay reference signal line couples a signal DRF to the reference delay unit 105. Each of the clock delay units 103-1, 103-2, 103-3 and 103-4 has an output (DO1, DO2, DO3, DO4) coupled to the delay output multiplexer 115. The output of the delay output multiplexer 115 is coupled to another input the write driver 120. The output of the reference delay unit 105 and output of the delay output multiplexer 115 are coupled to the calibration unit 110. The control unit 100 is coupled to the clock delay generator 101, the calibration unit 110 and the delay output multiplexer 115.

In precompensation operation, the clock delay generator 101 receives successive data signals DATA(m) to be written. For each received data signal, clock delay data is generated in the clock delay generator 101 to compensate for transition shifting on the basis of a pattern of adjacent preceding data signals DATA(m), DATA(m−1), DATA(m−2), etc., or surrounding data signals DATA(m−1), DATA(m), DATA(m+1), etc. The clock delay data signals DL1, DL2, DL3 and DL4 are applied to the clock delay units preferably sequentially so that clock delay unit 103-1 receives the clock delay data for the data signals DATA(m), DATA(m+4), DATA(M+8), . . . The clock delay unit 103-2 receives the clock delay data for the data signals DATA(m+1), DATA(m+5), DATA(m+9), . . . The clock delay unit 103-3 receives the clock delay data for the data signals DATA(m+2), DATA(m+6), DATA(m+10), . . . The clock delay unit 103-4 receives the clock delay data for the data signals DATA(m+3), DATA(m+7), DATA(m+11), . . .

As is well known in the art, each clock delay unit requires a period of time after clock delay data for a data signal is applied thereto to adjust the phase of its delay output to correspond to the applied clock delay data. In accordance with the invention, the number of clock delay units is based on the adjustment period rather than the number of data signals used to determine precompensation. In FIG. 1, it is assumed that the delay adjustment period is less than four data signal clocking periods so that the clock delay data for data signal DATA(m) is applied to clock delay unit 103-1 while the delay output of the clock delay unit 103-2 which previously received the clock delay data for the data signal DAT (m−3) is selected by the delay output multiplexer 115 to determine the recording time for the data signal DAT(m−3) being output from the clock delay generator 101 to the write driver 120. Of course, as will be appreciated by one of ordinary skill in the art, it is contemplated that delay output multiplexer 115 may select the clock delay units in a non sequential manner.

The arrangement of FIG. 1 also operates in a calibration mode to calibrate the delays of the clock delay units 103-1, 103-2, 103-3 and 103-4. The calibration is provided through the use of the reference delay unit 105 and the calibration unit 110. Upon start-up or a change in writing clock rate, a delay for an uncompensated transition corresponding to the writing clock rate is set into reference delay unit 105. The output of each of the clock delay units without clock delay data input thereto is then compared to the delay set in the reference delay unit. A signal corresponding to the difference between the delay set in reference delay unit and the delay output of each clock delay unit is generated and stored in the clock delay generator as an offset value which is added to the clock delay information obtained for the pattern of adjacent data to be applied to the clock delay unit. In this way, the each of the clock delay units is calibrated for operation at the current writing clock rate.

The control 100 provides signals to the clock delay generator 101 and to the delay output multiplexer 115 to synchronize the outputting of the clock delay data signals DL1, DL2, DL3 and DL4 from the clock delay generator 101 with the multiplexing of the delay output signals DO1, DO2, DO3 and DO4 in the delay output multiplexer 115 during precompensation. In order to allow sufficient time for each clock delay unit to adjust its output to the newly received clock delay data, one clock delay unit receives the clock delay data for the data signal DATA(m) while the clock delay unit that received the clock delay data for the data signal DATA(m−n+1) outputs a delay control signal DO to control the recording time of the data signal DATA(m−n+1). The number of clock delay units must be more than the number of writing clock periods required for each clock delay unit to adjust its output to the received clock delay data. In the calibration mode, the control 100 operates to provide control signals to the clock delay generator 101, the calibration unit 110 and the multiplexer 115 to sequentially compare the outputs of the clock delay units DL1, DL2, DL3 and DL4 without clock delay data applied thereto to the delay output of the reference delay unit 105 and to store the resulting clock delay unit offsets in the clock delay generator 101.

FIG. 2 is a more detailed block diagram of the clock delay generator of FIG. 1. In FIG. 2, there are shown shift registers 201 and 205 to which data signals to be written are applied, a delay look-up table 210, a delay offset store 215, summing units 220-1, 220-2, 220-3 and 220-4 and a delay unit sequencer 225. The shift register 201 receives incoming data and has a delayed output coupled to the write driver 220 of FIG. 1. The shift register 205 receives the data to be written and is coupled to the delay look-up table 210 which in turn is coupled to the combining units 220-1, 220-2, 220-3 and 220-4. Delay offset store 215 receives offset values from the calibration unit 110 and is coupled to the combining units 220-1, 220-2, 220-3 and 220-4 which are in turn coupled to the clock delay units 103-1, 103-2, 103-3 and 103-4 of FIG. 1, respectively. The delay unit sequencer 225 receives timing control signals from the control 100 in FIG. 1 and is coupled to the combining units 220-1, 220-2, 220-3 and 220-4.

In the precompensation arrangement having four clock delay units, a pattern of adjacent data signals consists of the current data signal DATA(m) and the 2 preceding data signals DATA(m−1) and DATA(m−2) may be used to determine the recording time of the DATA(m) data signal. The shift register 201 receives the data signal DATA(m) to be written and provides an output delayed by three data signal units to account for the clock delay unit adjustment period of the clock delay unit that will receive the clock delay data for the data signal DATA(m). The shift register 205 receives the data signal DATA(m) and presents the pattern of data signals DATA(m), DATA(m−1) and DATA(m−2) to the look-up table 210 under control of a signal from the control 100 in FIG. 1. The look-up table 210 is arranged to output clock delay information to each of combiners 220-1, 220-2, 220-3 and 220-4 in response to the states of the adjacent data signals DATA(m), DATA(m−1) and DATA(m−2). The clock delay information from the look-up table outputs clock delay information that has been pre-calculated according to the states of the data signals DATA(m), DATA(m−1) and DATA (m−2) to provide an appropriate shift in the recording time for the data signal DATA(m).

The delay offset store 215 supplies an offset value for each of the clock delay units 103-1, 103-2, 103-3 and 103-4 produced during a previous calibration to each of the combiners 220-1, 220-2, 220-3 and 220-4. The delay sequencer 225 operates to provide a rotating sequence of selection signals to the combiners so that one of the combiners (e.g., 220-1) is selected to form the clock delay data signal DL1 for the data signal DATA(m). The clock delay data signal DL1 is then input to the clock delay unit 103-1. Concurrently, the multiplexer 115 in FIG. 1 is controlled by the DS signal from the control 100 to pass the DO2 signal from the clock delay unit 103-2 to time the recording of the DAT(m−3) output from shift register 201 by the write driver 120.

In general, the clock delay generator sends a delay signal for the mth data signal concurrently with the outputting of the clock delay output signal corresponding to m−n+1 data signal from the next clock delay unit to receive clock delay data. While the operation of the clock delay generator has been described using a pattern of two preceding and the current data signals, it is to be understood that the registers 201 and 205 and the look-up table 210 may arranged to provide clock delay information for other patterns that include a set of N preceding data signals, N surrounding data signals or N succeeding data signals where N can be 2, 3, 4 or more.

Each of the clock delay units 103-1, 103-2, 103-3 and 103-4 receives a write clock signal CLK from the control 100 and a clock delay data signal DL from the clock delay generator 101. The clock delay unit may include a phase locked loop circuit that operates responsive to clock delay data DL from the clock delay generator to alter the phase of its output relative to the write clock CLK. A phase locked loop arrangement such as disclosed in aforementioned U.S. Pat. No. 6,133,861 which is incorporated by reference herein may be used. For such use, the clock delay data from the clock delay generator 101 is converted (e.g., by a digital to analog converter well known in the art) to a voltage which controls the phase of the clock delay unit output. Alternatively, a digital phase locked loop of the type may be used to alter the phase of the clock delay unit's DOn signal when supplied with the clock delay data from the clock delay generator 101.

FIG. 3 shows a block diagram of the calibration unit 110 of FIG. 1 that has a calibration control 301 and a comparator 305. The calibration control 301 receives a control signal from the control 100 of FIG. 1 and causes the comparator 305 to form delay offset signals for each of the clock delay units 103-1, 103-2, 103-3 and 103-4. The offset signals are stored in the delay offset store 215 of clock delay generator 101. A circuit that may be used as the comparator 305 is shown in FIG. 4. Referring to FIG. 4, there are shown an amplifier 440, a clock delay voltage former including an inverter 401, FETs 403 and 405, a constant current source 407 and a capacitor 409, a reference clock voltage former including an inverter 410, FETs 413 and 415, a constant current source 417 and a capacitor 419, a NAND gate 420, an inverter 425 and a delay 430.

The flow chart of FIG. 5 illustrates the operation during the calibration mode. Referring to FIGS. 4 and 5, the calibration mode is entered through the decision step 501 when a change of clock frequency in the control 100 is detected. Upon the detection, control is transferred to step 505 in which the index s (s=1, 2, 3, 4) for the clock delay units is initially set to 1. The delay output of the clock delay unit s is that of the present clock rate without any DLs input. The circuit of FIG. 4 is then activated in which the delay DRF of the reference delay unit which is standard for the present clock rate is compared with the delay DLs of the s clock delay unit. In FIG. 4, the DOs output of the s clock delay unit is selected by the delay output multiplexer 115 and is applied to an input of each of the inverters 401 and 405 and to the NAND gate 420. Concurrently, the output of the reference delay unit 105 is applied to an input of each of inverters 410 and 415 and to an input of NND gate 420.

The FET 405 is turned on by the DOs signal and the FET 403 is turned off by the output of the inverter 401. As a result, the capacitor 409 is charged linearly by the current source 407 for the duration of the DOs signal. Similarly, The FET 415 is turned on by the DOs signal and the FET 413 is turned off by the output of the inverter 401. Consequently, the capacitor 419 is charged linearly by the current source 407 for the duration of the reference clock output signal. Since, as is well known, two delay elements are not likely to be identical in implementation, the delay value of the clock delay units are assumed to be different. Accordingly, the capacitor 409 starts charging at a different time than the reference delay unit capacitor 419 so that the difference in delay is reflected in the output of the amplifier 440.

When outputs from both the reference delay unit and the clock delay unit s are obtained, the NAND gate 420 provides an output to inverter 425. The output of inverter 425 is delayed by the delay 430 and the amplifier 440 is strobed by the signal from the delay 430. The amplifier 440 outputs a signal CAL indicative of the offset of the delay of the clock delay unit s from the reference clock delay. As indicated in steps 510 and 515 of FIG. 5, the output DOs of the clock delay unit s is supplied to the calibration unit through the delay output multiplexer 115 and the value of the offset is generated and stored in the delay offset store 215. After the offset is stored, it is determined in step 525 whether offset values have been obtained for all clock delay units. If not, the loop including steps 510, 515 and 525 is iterated through step 530 for the remaining clock delay units.

After all clock delay units have been calibrated, step 601 of the precompensation mode illustrated by the flow chart of FIG. 6 is entered from step 525 of FIG. 5. In decision step 601 of FIG. 6, it is determined whether data signals are to be magnetically recorded. If not, decision step 501 of FIG. 5 is reentered to check for a change in clock frequency. If yes in the step 601, the clock delay unit index s is set to one and the data signal DATA(m) of the successive data signals to be written is received by the clock delay generator 101 of FIG. 1 (step 610). The look up table 210 receives the signals DATA(m), DATA(m−1) and DATA(m−2) and sets clock delay information for the data signal DATA(m) in step 615 responsive to the adjacent signals DATA(m), DATA(m−1) and DATA(m−2).

The clock delay data signal DLs is formed in the combiner 220-s from the look up table clock delay information and the offset stored in delay offset store 215 (step 620). Steps 625 and 628 are then entered concurrently wherein the clock delay unit that received the data signal DATA(m−3) sends the clock delay output signal DO for the data output signal DAT(m−3) to the write driver 120 via the delay output multiplexer 115 and the clock delay data signal DLs for the data signal DATA(m) is sent to the clock delay unit s. Decision step 630 is then entered in which whether the data signal DATA(m) is the last data signal to be recorded is determined. If yes, the step 501 of FIG. 5 is reentered to determine whether there is a change in clock frequency. Otherwise, the next clock delay unit in the rotating sequence of clock delay units 103-1, 103-2, 103-3 and 103-4 is selected in the step 635, the data signal index is incremented to m+1 in step 640 and the next data signal is received in the step 610.

While the invention has been described in conjunction with a specific embodiment, it is evident to those skilled in the art that many further alternatives, modifications and variations will be apparent in light of the foregoing description. Moreover, it is contemplated that the present invention is not limited to the particular circuit arrangement described and may utilize other appropriate operational amplifier and feedback arrangements. Thus, the invention described herein is intended to embrace all such alternatives, modifications, applications and variations as may fall within the spirit and scope of the appended claims.

What is claimed is:

1. A pre-compensation circuit for recording of data signals, comprising:
   a clock delay generator configured to generate clock delay data relative to a clock signal at a predetermined clock rate for each successive data signal to be recorded responsive to a pattern of adjacent data signals;
   n clock delay units configured to control recording times of the successive data signals,
      wherein n>1, and
      wherein each of the clock delay units is configured to generate an output signal for determining the recording time of one data signal in each sequence of n successive data signals responsive to the clock delay data received by the clock delay unit for the one data signal in the sequence;
   a reference clock delay unit responsive to the clock signal configured to produce reference clock delay information at the predetermined clock rate; and
   a calibrator responsive to the reference clock delay information configured to calibrate each of the n clock delay units to a change in the predetermined clock rate.

2. The pre-compensation circuit of claim 1, wherein a clock delay unit is configured to receive the clock delay data corresponding to an mth data signal of successive data signals in a clock period during which the clock delay unit that received the clock delay data corresponding to an (m−n+1)th data signal of the successive data signals is configured to generate the output signal for determining the recording time of an (m−n+1)th data signal.

3. The pre-compensation circuit of claim 1, wherein each clock delay unit comprises a reprogrammable clock delay unit that is reprogrammed for the one data signal received in each sequence of successive data signals.

4. The pre-compensation circuit of claim 1, wherein each pattern of adjacent data signals includes at least one of a pattern of data signals immediately preceding the data signal for which the clock delay data is generated and a set of data signals immediately succeeding the data signal for which the clock delay data is generated.

5. The pre-compensation circuit of claim 1, wherein each pattern of adjacent data signals includes a pattern of data signals surrounding the data signal for which the clock delay data is generated.

6. The pre-compensation circuit of claim 1, comprising:
a selector configured to select the output signals of the n clock delay units successively in each n data signal sequence to control the recording times of the successive data signals of the sequence so that the clock delay data for an mth data signal is received by one of the n clock delay units while the output signal of the clock delay unit that is to receive an (m+1)th data signal is configured to control the recording time of an (m−n+1)th data signal.

7. The pre-compensation circuit of claim 1, wherein the clock delay generator comprises:
a look-up table responsive to the pattern of adjacent data signals configured to form clock delay data relative to the generated clock signal for each successive data signal.

8. The pre-compensation circuit of claim 1, wherein the clock delay generator comprises:
a look-up table responsive to the pattern of adjacent data signals for each data signal configured to form clock delay information; and
a combining unit configured to combine the reference clock delay information with the look-up table formed clock delay information to generate the clock delay data for the data signal.

9. The pre-compensation circuit of claim 1, wherein the reference clock delay unit comprises:
a reprogrammable reference clock delay unit that is reprogrammed responsive to a change in the predetermined clock rate.

10. The pre-compensation circuit of claim 1, wherein the calibrator comprises:
a comparator configured to compare the reference clock delay information to the output signals of the at least one clock delay unit to form an offset value for each clock delay unit.

11. The pre-compensation circuit of claim 1, wherein each clock delay unit includes an interpolator configured to interpolate the clock delay data.

12. The pre-compensation circuit of claim 1, wherein the at least one clock delay unit is configured to sequentially control recording times of the successive data signals.

13. A method of pre-compensating recording of data signals, comprising the steps of:

a) generating clock delay data relative to a clock signal at a predetermined clock rate for each successive data signal to be recorded responsive to a pattern of adjacent data signals;
b) sequentially controlling recording times of the successive data signals by n clock delay units,
wherein n>1, and
wherein each of the clock delay units generates an output signal for determining the recording time of one data signal in each sequence of n successive data signals responsive to the clock delay data received by the clock delay unit for the one data signal of the sequence;
c) producing reference clock delay information at the predetermined clock rate responsive to the clock signal; and
d) calibrating each of the n clock delay units to a change in the predetermined clock rate responsive to the reference clock delay information.

14. The method of claim 13, wherein a clock delay unit receives the clock delay data corresponding to an mth data signal of successive data signals in a clock period during which the clock delay unit that received the clock delay data corresponding to an (m−n+1)th data signal of the successive data signals generates the output signal for determining the recording time of the (m−n+1)th data signal.

15. The method of claim 13, wherein each clock delay unit is reprogrammed for the one data signal received in each sequence of n successive data signals.

16. The method of claim 13, wherein each pattern of adjacent data signals includes at least one of a pattern of data signals immediately preceding the data signal for which the clock delay data is generated and a set of data signals immediately succeeding the data signal for which the clock delay data is generated.

17. The method of claim 13, wherein each pattern of adjacent data signals includes a pattern of data signals surrounding the data signal for which the clock delay data is generated.

18. The method of claim 13, comprising the step of:
e) selecting the output signals of the n clock delay units successively in each n data signal sequence to control the recording times of the successive data signals of the sequence so that the clock delay data for an mth data signal is received by one of the n clock delay units while the output signal of the clock delay unit that is to receive an (m+1)th data signal controls the recording time of an (m−n+1)th data signal.

19. The method of claim 13, wherein the step of generating the clock delay data comprises the step of:
obtaining clock delay information from a look-up table responsive to the pattern of adjacent data signals for forming clock delay data relative to the generated clock signal for each successive data signal.

20. The method of claim 13, wherein step (a) includes the steps of:
e) obtaining clock delay information from a look-up table responsive to the pattern of adjacent data signals for each data signal; and
f) combining the reference clock delay information with the look-up table formed clock delay information to generate the clock delay data for the data signal.

21. The method of claim 13, wherein the reference clock delay information is re-calibrated responsive to the change in the predetermined clock rate.

22. The method of claim 13, wherein step (d) comprises the step of:

e) comparing the reference clock delay information to the output signals of the at least one clock delay unit to form an offset value for each clock delay unit.

23. The method of claim 13, wherein each clock delay unit interpolates the received clock delay data.

24. A pre-compensation circuit for recording of data signals, comprising:
   clock delay generating means for generating clock delay data relative to a clock signal at a predetermined clock rate for each successive data signal to be recorded responsive to a pattern of adjacent data signals;
   n clock delay means for controlling recording times of the successive data signals,
      wherein n>1, and
      wherein each of the clock delay means is configured to generate an output signal for determining the recording time of one data signal in each sequence of n successive data signals responsive to the clock delay data received by the clock delay means in the sequence for the one data signal;
   a reference clock delay means responsive to the clock signal for producing reference clock delay information at the predetermined clock rate; and
   a calibration means responsive to the reference clock delay information for calibrating each of the n clock delay means to a change in the predetermined clock rate.

25. The pre-compensation circuit of claim 24, wherein a clock delay means is configured to receive the clock delay data corresponding to an mth data signal of successive data signals in a clock period during which the clock delay means that received the clock delay data corresponding to an (m−n+1)th data signal of the successive data signals is configured to generate the output signal for determining the recording time of the (m−n+1)th data signal.

26. The pre-compensation circuit of claim 24, wherein each clock delay means comprises:
   reprogrammable clock delay means that is reprogrammed for the one data signal received in each sequence of successive data signals.

27. The pre-compensation circuit of claim 24, wherein each pattern of adjacent data signals includes at least one of a pattern of data signals immediately preceding the data signal for which the clock delay data is generated and a set of data signals immediately succeeding the data signal for which the clock delay data is generated.

28. The pre-compensation circuit of claim 24, wherein each pattern of adjacent data signals includes a pattern of data signals surrounding the data signal for which the clock delay data is generated.

29. The pre-compensation circuit of claim 24, comprising:
   a selecting means for selecting the output signals of the n clock delay means successively in each n data signal sequence to control the recording times of the successive data signals of the sequence so that the clock delay data for an mth data signal is received by one of the n clock delay means while the output signal of the clock delay means that is to receive an (m+1)th data signal is configured to control the recording time of an (m−n+1)th data signal.

30. The pre-compensation circuit of claim 24, wherein the clock delay generating means comprises:
   means responsive to the pattern of adjacent data signals for looking up clock delay data relative to the generated clock signal for each successive data signal.

31. The pre-compensation circuit of claim 24, wherein the clock delay generating means comprises:

look-up means responsive to the pattern of adjacent data signals for each data signal for forming clock delay information; and
   combining means for combining the reference clock delay information with the look-up means formed clock delay information to generate the clock delay data for the data signal.

32. The pre-compensation circuit of claim 24, wherein the reference clock delay means comprises:
   a reprogrammable reference clock delay means that is reprogrammed responsive to a change in the predetermined clock rate.

33. The pre-compensation circuit of claim 24, wherein the calibration means comprises:
   a comparing means for comparing the reference clock delay information to the output signals of the at least one clock delay means to form an offset value for each clock delay means.

34. The pre-compensation circuit of claim 24, wherein each clock delay means includes:
   interpolating means for interpolating the received clock delay data.

35. The pre-compensation circuit of claim 24, wherein the at least one clock delay means is configured to sequentially control recording times of the successive data signals.

36. In a pre-compensation circuit for recording of data signals, a computer-usable medium having computer readable program units embodied therein, comprising:
   a first program unit for determining clock delay data relative to a clock signal at a predetermined clock rate for each successive data signal to be recorded responsive to a pattern of adjacent data signals;
   a second program unit for controlling sequential operation of n programmable clock delay units to determine the recording time of the successive data signals,
      wherein n>1, and
      wherein each of the programmable clock delay units is controlled to generate an output signal for determining the recording time of one data signal in each sequence of n successive data signals responsive to the clock delay data received by the programmable clock delay unit for the one data signal in the sequence;
   a third program unit for producing reference clock delay information at the predetermined clock rate; and
   a fourth program unit for calibrating each of the n programmable clock delay units to a change in the predetermined clock rate.

37. The computer-usable medium of claim 36, wherein the second program unit is configured to control a programmable clock delay unit to receive the clock delay data corresponding to an mth data signal of successive data signals in a clock period during which the programmable clock delay unit that received the clock delay data corresponding to an (m−n+1)th data signal of the successive data signals is configured to generate the output signal for determining the recording time of the (m−n+1)th data signal.

38. The computer-usable medium of claim 36, wherein the second program unit includes a program unit that reprograms each programmable clock delay unit for the one data signal received in each sequence of successive data signals.

39. The computer-usable medium of claim 36, comprising:
   a fifth program unit for selecting output signals of the n programmable clock delay units successively in each n data signal sequence to control the recording times of the successive data signals of the sequence so that the clock delay data for an mth data signal is received by one of the n programmable clock delay units while the output signal of the programmable clock delay unit that is to receive an (m+1)th data signal is configured to control the recording time of an (m−n+1)th data signal.

40. The computer-usable medium of claim 36, wherein the first program unit includes:
a program unit for obtaining clock delay information from a look-up table for each data signal responsive to the pattern of adjacent data signals; and
a program unit for combining the look-up table clock data information for each data signal with the reference clock data information for the programmable clock delay unit to which clock delay data for the data signal is sent to form the clock delay data for the data signal.

41. The computer-usable medium of claim 36, comprising:
a fifth program unit responsive to a change in write clock rate for reprogramming the reference clock delay information of each programmable clock delay unit responsive to the change in the predetermined clock rate.

* * * * *

UNITED STATES PATENT AND TRADEMARK OFFICE
CERTIFICATE OF CORRECTION

PATENT NO. : 7,184,231 B1
APPLICATION NO. : 11/250373
DATED : February 27, 2007
INVENTOR(S) : Pantas Sutardja et al.

It is certified that error appears in the above-identified patent and that said Letters Patent is hereby corrected as shown below:

| | |
|---|---|
| Column 2, Line 30: | Delete "It" and insert --it-- |
| Column 4, Line 42: | Insert --of-- after "input" |
| Column 4, Line 59: | Delete "M+8" and insert --m+8-- |
| Column 5, Line 11: | Delete "DAT" and insert --DATA-- |
| Column 5, Line 12: | Delete "DAT" and insert --DATA-- |
| Column 5, Line 32: | Delete "the" after "way," |
| Column 6, Line 43: | Delete "DAT" and insert --DATA-- |
| Column 6, Line 52: | Insert --be-- after "arranged" |
| Column 7, Line 38: | Delete "NND" and insert --NAND-- |
| Column 7, Line 42: | Delete "The" and insert --the-- after "Similarly," |
| Column 8, Line 21: | Delete "DAT" and insert --DATA-- |

Signed and Sealed this

Fifth Day of June, 2007

JON W. DUDAS
*Director of the United States Patent and Trademark Office*